(12) United States Patent
Matsushita et al.

(10) Patent No.: US 7,834,701 B2
(45) Date of Patent: Nov. 16, 2010

(54) BIAS CIRCUIT AND SEMICONDUCTOR INTEGRATED CIRCUIT INCLUDING THE BIAS CIRCUIT

(75) Inventors: Tsuyoshi Matsushita, Osaka (JP); Koji Oka, Osaka (JP); Junichi Naka, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 12/519,291

(22) PCT Filed: May 28, 2008

(86) PCT No.: PCT/JP2008/001335

§ 371 (c)(1),
(2), (4) Date: Jun. 15, 2009

(87) PCT Pub. No.: WO2008/149517

PCT Pub. Date: Dec. 11, 2008

(65) Prior Publication Data

US 2010/0045382 A1 Feb. 25, 2010

(30) Foreign Application Priority Data

Jun. 4, 2007 (JP) ............................. 2007-148361

(51) Int. Cl.
*H03F 3/04* (2006.01)
(52) U.S. Cl. ...................................... 330/296; 330/285
(58) Field of Classification Search ................ 330/296, 330/285, 252, 260
See application file for complete search history.

(56) References Cited

U.S. PATENT DOCUMENTS

| | | | |
|---|---|---|---|
| 5,268,599 A * | 12/1993 | Matsui | 326/71 |
| 5,302,863 A * | 4/1994 | Walley et al. | 327/60 |
| 5,399,986 A | 3/1995 | Yen | |
| 7,149,123 B2 * | 12/2006 | Georgescu et al. | 365/185.03 |
| 7,277,129 B1 * | 10/2007 | Lee | 348/308 |
| 7,365,597 B2 * | 4/2008 | Forbes | 330/9 |
| 2004/0150464 A1 | 8/2004 | Khalid | |
| 2006/0007726 A1 | 1/2006 | Khalid | |
| 2006/0132193 A1 | 6/2006 | Tsuchi | |

(Continued)

FOREIGN PATENT DOCUMENTS

JP     04-086907     3/1992

(Continued)

*Primary Examiner*—Henry K Choe
(74) *Attorney, Agent, or Firm*—McDermott Will & Emery LLP

(57) ABSTRACT

A plurality of analog signals are input to input terminals of an analog signal processing circuit ANA2 via respective capacitors C. In a bias circuit Bias for supplying a bias voltage such as a signal ground of the analog signals to the analog signal processing circuit ANA2, in an operational amplifier OpAS, a bias voltage VIr is input from a non-inverting input VIP of a built-in differentiate amplifier circuit, an output terminal of the built-in output amplifier circuit OA1 is connected to an inverting input terminal VIM of the differentiate amplifier circuit DA, and thereby a voltage follower is obtained. Furthermore, a plurality of output amplifier circuits OA2 through OAn are provided so that input terminals thereof are connected to output terminals of the differential amplifier circuit DA, and the output terminals are connected to input terminals IN1 through INn of the analog signal processing circuit ANA2.

10 Claims, 11 Drawing Sheets

U.S. PATENT DOCUMENTS

2007/0103227 A1   5/2007   Khalid

FOREIGN PATENT DOCUMENTS

| JP | 05-121974 | 5/1993 |
|----|-----------|--------|
| JP | 7-202589 | 8/1995 |
| JP | 08-288758 | 11/1996 |
| JP | 11-112244 | 4/1999 |
| JP | 2006-516863 | 7/2006 |

* cited by examiner

US 7,834,701 B2

BIAS CIRCUIT AND SEMICONDUCTOR INTEGRATED CIRCUIT INCLUDING THE BIAS CIRCUIT

RELATED APPLICATIONS

This application is the U.S. National Phase under 35 U.S.C. §371 of International Application No. PCT/JP2008/001335, filed on May 28, 2008, which in turn claims the benefit of Japanese Application No. 2007-148361, filed on Jun. 4, 2007, the disclosures of which Applications are incorporated by reference herein.

TECHNICAL FIELD

The present disclosure relates to a bias circuit employing a multi-output operational amplifier for supplying a necessary bias voltage to a plurality of input terminals of an analog circuit capacitively coupled with another analog circuit for outputting a plurality of analog signals, which receive the analog signals.

BACKGROUND ART

A bias circuit employing a multi-output operational amplifier is used for a system or a semiconductor integrated circuit in which a plurality of analog signals from an analog signal processing circuit such as a high frequency signal processing circuit or the like are input to an analog signal processing circuit such as an A/D converter or the like via respective capacitors.

In many cases, signal grounds of a plurality of analog signals output from an analog signal processing circuit such as a high frequency signal circuit or the like are different from one another in such a system or semiconductor integrated circuit. Therefore, the system or circuit is configured so that one or more capacitors are inserted between two analog signal processing circuits which send and receive a plurality of analog signals to electrically block signal grounds of the plurality of analog signals, and the signal grounds are supplied as a common voltage by a bias circuit employing a multi-output operational amplifier.

Currently, the scale and operation speed of systems demanded in semiconductor integrated circuits are increased more and more and the power consumption and circuit area thereof are reduced more and more. Therefore, the number of cases in which a plurality of analog signals have to be transmitted between two capacitively coupled analog signal processing circuits has been significantly increased. Situations arise more frequently where a bias circuit employing a multi-output operational amplifier is used.

Hereinafter, known configurations for a bias circuit employing a multi-operational amplifier will be descried.

A first prior art will be descried with reference to FIG. 9. When N analog signals are input to an analog signal processing circuit ANA2 from an analog signal output circuit ANA1 via respective capacitors C, there can be a configuration in which N operational amplifiers OpAS1, OpAS2, ... OpASn respectively corresponding to N terminals to which a bias voltage has to be supplied are provided so that each of the amplifiers makes up a voltage follower, a desired bias voltage VIr such as a signal ground (hereinafter referred to as "SG") or the like is supplied to the input terminals VIP1, VIP2, ... VIPn of the voltage followers, and the bias voltage VIr is supplied to each of the input terminals IN1, IN2, ... INn of the analog signal processing circuit ANA2 from respective output terminals VOp1, VOp2, ... VOpn via respective resistors R.

Next, a second prior art will be described with reference to FIG. 10. In FIG. 10, one operational amplifier OpAS is provided to make up a voltage follower, a desired bias voltage VIr is input to an input terminal VIP of the voltage follower, an output terminal VOp of the operational amplifier OpAS is connected to a plurality of output terminals VO1 through VOn of a bias circuit Bias via a plurality of respective resistors R, and the bias voltage VIr such as SG is supplied to each of input terminals IN1 through INn.

Then, a third prior art will be described with reference to FIG. 11. This prior art is described in Patent Document 1. In FIG. 11, a differential amplifier circuit OpAS and a plurality of output amplifier circuits OA1, OA2, ... OAn are configured to serve as a system AmpM and a signal, i.e., a bias voltage, received by this system is supplied to each of input terminals IN1 through INn of the analog signal processing circuit ANA2. In this system configuration, the bias voltage VIr is supplied to a non-inverting input terminal VIP of the differential amplifier circuit OpAS, an output terminal VOp of the differential amplifier circuit OpAS is connected to a plurality of input terminals of the plurality of output amplifier circuits OA1 through OAn, each of respective output terminals VOp1, VOp2, ... VOpn of the plurality of the output amplifier circuits OA1 through OAn is connected to the non-inverting amplifier terminal VIM of the differential amplifier circuit OpAS via an associated one of feedback resistors Rf, and the non-inverting input terminal VIM of the differential amplifier circuit OpAS is connected to a base voltage (ground voltage) via a reference resistor Rs. Thus, this system is configured to serves as a circuit which is as a non-inverting amplifier circuit having a common input terminal and a plurality of outputs and the gain of which is determined by the ratio between the feedback resistor Rf and the reference resistor Rs.

Patent Reference 1: Japanese Laid-Open Publication No. H07-202589

DISCLOSURE OF THE INVENTION

Problems which the Invention is to Solve

However, according to the first prior art of FIG. 9, a bias circuit employing a plurality of voltage followers is provided and a plurality of the operational amplifiers are used. Therefore, if an analog signal processing circuit in a next stage to which the bias circuit is connected has a large number of input terminals, the number of necessary voltage followers, i.e., operational amplifiers is increased to cause increase in its power consumption and area, and an offset between the input terminals of the analog signal processing circuit is increased in proportion to the number of the input terminals. There is also another drawback that, in order to satisfy an allowable value of the offset between input terminals, which is required in the system, the offset voltage has to be restricted to a very low level. Note that the area and power consumption of the bias circuit, and the offset between the input terminals of the analog signal processing circuit are in a trade-off relation and the offset between the internal terminals of the analog signal processing circuit can be reduced by increasing an area of a pair of input transistors of the differential amplifier circuit included in the operational amplifier and a gain of the operational amplifier. However, according to this technique, increase in area and power consumption of the bias circuit is disadvantageously caused.

In the second prior art of FIG. 10, a bias circuit in which one operational amplifier is provided as a voltage follower is used.

Thus, unlike the first prior art, even when an analog signal processing circuit in a next stage has a large number of input terminals, the number of operational amplifier does not have to be increased and the offset between the input terminals of the analog signal processing circuit is not increased. However, since the input terminals of the analog signal processing circuit are connected via a single output terminal VOp and the resistors R, mutual interference, i.e., interference by a signal input to any one of the input terminals to the other input terminals via the output terminal VOp is unavoidable when signals having different voltages are input to the input terminals of the analog signal processing circuit. Note that as a configuration for reducing the mutual interference between the input terminals, a configuration in which respective resistor values of a plurality of resistors R connected to an output side of the operational amplifier is increased can be adopted. Using this configuration, however, the area of the bias circuit is disadvantageously increased. Moreover, in the second prior art, the number of the input terminals of the analog signal processing circuit is increased, the number of necessary resistors R which are respectively connected to output terminals of the voltage follower (i.e., one operational amplifier) is increased and thus an output load is increased. Therefore, disadvantageously, the power consumption and area of the output amplifier circuit is increased.

In the third prior art of FIG. 11, as in the second prior art, a bias circuit in which the one operational amplifier is provided to make up a voltage follower. Thus, an offset between the input terminals of the analog signal processing circuit is not increased. However, since output sides of the plurality of output amplifier circuits OA1, OA2, . . . OAn are connected via the non-inverting input terminal VIM of the operational amplifier OpAS and respective resistors R, mutual interference due to differences between in voltage between signals input to the input terminals IN1, IN2, . . . INn of the analog signal processing circuit is unavoidable. Moreover, as in the second prior art, when the number of input terminals of the analog processing circuit is increased, an output load on the operational amplifier is increased. Thus, increase in the power consumption and area of the output amplifier circuit of the operational amplifier is also caused in the third prior art.

In view of the above-described problems, the present invention has been devised and the disclosure of the present invention provides, basically by means of adopting a bias circuit in which one operational amplifier is provided as a voltage follower in the same manner as in the second prior art and the third prior art, a bias circuit which allows prevention of mutual interference between input terminals of an analog signal processing circuit without causing increase in area and power consumption of the bias circuit while taking measures to prevent increase in offset between the input terminals of the analog signal processing circuit.

Solution to the Problems

To achieve the above-described bias circuit, according to the disclosure of the present invention, a bias circuit in which one operational amplifier including a differential amplifier circuit and an output amplifier circuit is used as a voltage follower is adopted; and two or more output amplifier circuits each having the same configuration as that of the operational amplifier are provided so that the output amplifier circuits and a differential amplifier circuit of the one operational amplifier constitute a plurality of operational amplifiers which share the differential amplifier, and output terminals of the output amplifier circuits are provided to serve as terminals to be connected to input circuits of an analog signal processing circuit.

Specifically, a bias circuit according to the present disclosure is a bias circuit which outputs the same bias voltage through a plurality of output terminals thereof is characterized by including: an operational amplifier having a differential amplifier circuit and a built-in CMOS output amplifier circuit including a first transistor and a second transistor with a gate to which an output voltage of the differential amplifier circuit is given; and a plurality of CMOS output amplifier circuits each including third and fourth transistors each of which has the same configuration as that of the built-in CMOS output amplifier circuit, and also is characterized in that in the differential amplifier circuit of the operational amplifier, a constant voltage is supplied to a non-inverting input circuit and an output of the built-in CMOS output amplifier circuit of the operational amplifier is fed back to an inverting input terminal, the built-in CMOS output amplifier circuit and the plurality of CMOS output amplifier circuits are connected in parallel, a gate of the third transistor of each of the plurality of CMOS output amplifier circuits is connected to a gate of the first transistor of the built-in CMOS output amplifier circuit and a gate of the fourth transistor of each of the plurality of CMOS output amplifier circuits is connected to the gate of the second transistor of the built-in CMOS output amplifier circuit, and a drain connection point of the third and fourth transistors of each of the plurality of CMOS output amplifier circuits is connected to an associated one of the plurality of output terminals.

In one embodiment of the present invention, the bias circuit is characterized in that a drain connection point of the first and second transistors of the built-in CMOS output amplifier circuit is connected to one of the plurality of output terminals to which the plurality of CMOS output amplifier circuits are not connected.

In one embodiment of the present invention, the bias circuit is characterized in that at least one of the plurality of CMOS output amplifier circuits includes an output current adjusting circuit which can variably adjust a current output from its own CMOS output amplifier circuit, and an operation of the output current adjusting circuit is controlled according to a frequency of a signal output from an output terminal to which its own CMOS output amplifier circuit is connected.

In one embodiment of the present invention, the bias circuit is characterized in that at least one of the plurality of CMOS output amplifier circuits each includes a start/stop control circuit for starting and stopping its own CMOS output amplifier circuit.

In one embodiment of the present invention, the bias circuit is characterized in that input circuits of an analog signal processing circuit are connected to the plurality of output circuits, respectively, and the start/stop control circuit includes a stop state setting circuit for setting, when stopping its own CMOS output amplifier circuit, a stop state of its own CMOS output amplifier circuit to a stop state in which deterioration with time, of the input terminal is prevented.

In one embodiment of the present invention, the bias circuit is characterized in that in each of the built-in CMOS output amplifier circuits of the operational amplifier and the plurality of CMOS output amplifier circuits, the output terminal and the input terminal are connected via a feedback circuit.

In one embodiment of the present invention, the bias circuit is characterized in that in each of the built-in CMOS output amplifier circuits of the operational amplifier and the plurality of CMOS output amplifier circuits, the input terminal and a base voltage are connected via a feedback circuit.

In one embodiment of the present invention, the bias circuit is characterized in that in each of the built-in CMOS output amplifier circuits of the operational amplifier and the plurality of CMOS output amplifier circuits, the input terminal and a power supply voltage are connected via a feedback circuit.

In one embodiment of the present invention, the bias circuit is characterized in that the differential amplifier circuit of the operational amplifier and the plurality of CMOS output amplifier circuits are provided so that the differential amplifier circuit and each of the plurality of CMOS output amplifier circuits make up a single operational amplifier of a two-stage amplifier type.

A semiconductor integrated circuit according to the disclosure of the present invention is characterized by including: the bias circuit, an analog signal processing circuit provided in a subsequent stage to be connected to the bias circuit and having an input circuit for receiving a bias voltage from the plurality of output circuits of the bias circuit; and an analog signal output circuit for outputting a plurality of analog signals to the analog signal processing circuit via a plurality of capacitors.

As described above, according to the present disclosure, one differential amplifier circuit is used in common and thus increase in offset of a bias voltage such as signal grounds generated between input terminals of an analog signal processing circuit in a subsequent stage, which is connected thereto, can be effectively suppressed. Moreover, output sides of a plurality of output amplifier circuits are connected to input terminals of the analog signal processing circuit in the subsequent stage and a bias voltage is supplied to each of the input terminals. Accordingly, the input terminals are not electrically connected but independent from one another and thus interference between signals input to the input terminals of the analog signal processing circuit in the subsequent stage avoidable. Furthermore, when an analog signal processing circuit having a large number of input terminals is connected as a circuit provided in the subsequent stage, the number of output amplifier circuits of the bias circuit is increased according to the number of the input terminals and the output terminals are connected to the input terminals of the analog signal processing circuit in the subsequent stage. Thus, output load on each of the output amplifier circuits become uniform between the output amplifiers and is not increased.

EFFECTS OF THE INVENTION

As has been described above, with a bias circuit according to the present disclosure, increase in offset between input terminals of an analog signal processing circuit in a next stage, which is connected to the bias circuit, is not caused and mutual interference between the input terminals of the analog signal processing circuit can be effectively prevented without increasing the area and power consumption of the bias circuit.

EXPLANATION OF REFERENCE NUMERALS

IN1 through INn Input terminals
VIr Desired bias voltage
VO1 through VOn Output terminals of a bias circuit
C Capacitor
DA Differential amplifier circuit
OA1 First CMOS output amplifier circuit (built-in COMS output amplifier circuit)
OA2 through OAn CMOS output amplifier circuit
OpAS Single output operational amplifier
OpA Multi-output operational circuit
Rf, Rs Feedback resistor, Reference resistor
OAnt Adjusting output amplifier circuit
SWt Switch
SWpt Switch
SWnt Switch
SWpc Switch
SWnc Switch
Cs1 through Csn Phase compensating capacitors
AB Bias circuit for differential amplifier circuit and output amplifier circuit
CAC Output current adjusting circuit
SSC Start/stop control circuit
TDS Stop state setting circuit
Z Phase compensating circuit

BEST MODE FOR CARRYING OUT THE INVENTION

First Embodiment

A bias circuit according to a first embodiment of the present invention will be described with reference to FIG. 1.

Figure 1:
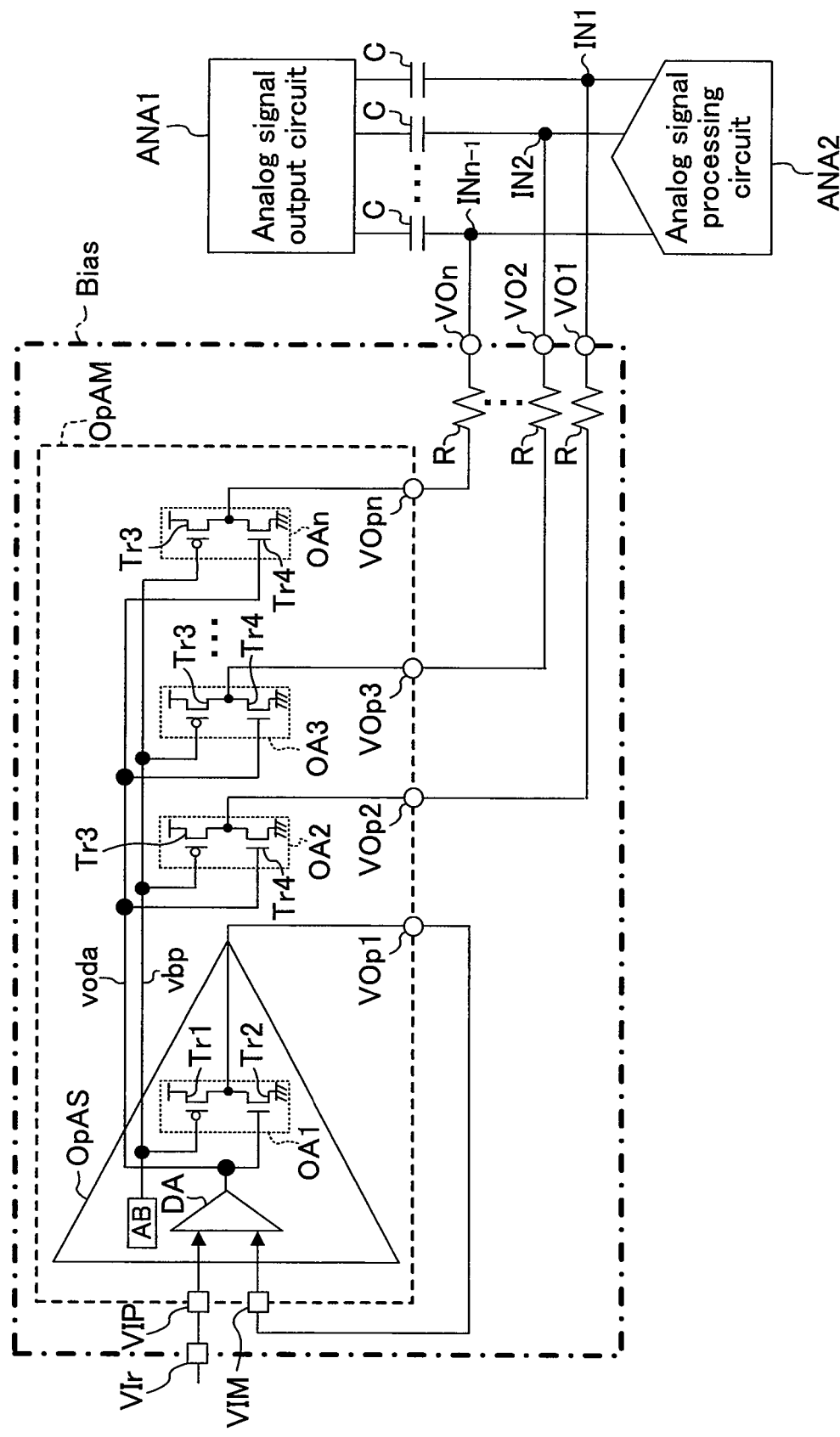
FIG. 1 is a block diagram illustrating a configuration of a bias circuit according to a first embodiment of the present invention.

In FIG. 1, a desired bias voltage VIr which is necessary at (N-1) input terminals is given to a non-inverting input terminal VIP of a differential amplifier circuit DA in an operational amplifier OpAS. The desired bias voltage VIr is generated by a constant-voltage source (not shown) or the like. The constant-voltage source is formed of a circuit for supplying a constant voltage including a band gap reference. An output of a first CMOS output amplifier circuit (built-in CMOS output amplifier circuit) OA1 is fed back to an inverting input terminal VIM of the differential amplifier circuit DA in the operational amplifier OpAS and thereby makes up a voltage follower.

To first and second transistors Tr1 and Tr2 configured to serve as the first CMOS output amplifier circuit OA1, third and fourth transistors Tr3 and Tr4 configured to serve as a second CMOS output amplifier circuit OA2 corresponding to a CMOS output amplifier circuit of the operational amplifier OpAS are connected in parallel. A gate of the third transistor Tr3 is connected to a gate of the first transistor Tr1, and a gate of the fourth transistor Tr4 is connected to a gate of the second transistor Tr2.

Furthermore, a plurality of CMOS output amplifier circuits OA3 through OAn each having the same configuration as that of the second CMOS output amplifier circuit OA2 are connected in parallel to the first CMOS output amplifier circuit OA1 in the same manner as the second CMOS output amplifier circuit OA2.

In each of the CMOS output amplifier circuits OA1 through OAn, a bias voltage vbp is supplied to each of the respective gates of the p-type transistors Tr1 and Tr3 from a bias circuit AB to turn on the transistors. An output voltage voda of the differential amplifier circuit DA is given to each of the respective gates of the n-type transistors Tr2 and Tr4 of the CMOS output amplifier circuit OA1 through OAn.

In the second through nth CMOS output amplifier circuits OA2 through OAn, the bias voltage VIr is supplied from respective drain connection points VOp2 through VOpn of the third and fourth transistors Tr3 and Tr4 to input terminals IN1 through INn-1 of an analog signal processing circuit ANA2, which requires supply of a bias voltage, via respective resistors R.

The differential amplifier circuit DA and the first CMOS output amplifier circuit OA1 are configured to serve as a single differential input single output operational amplifier OpAS of a two-stage amplifier type. The differential amplifier circuit DA and the second CMOS output amplifier circuit OA2 are configured to serve as another single differential input single output operational amplifier of a two-stage amplifier type. Also, each of the second through nth CMOS output amplifier circuits OA2 through OAn is configured to serve together with the differential amplifier circuit DA as a single differential input single output operational amplifier of a two-stage amplifier type. Thus, a differential input multi-output operational amplifier OpAM is configured of the differential amplifier circuit DA and the first through nth CMOS output amplifier circuits OA1 through OAn.

In the bias circuit Bias, the differential amplifier circuit DA and the first CMOS output amplifier circuit OA1 make up a voltage follower and a bias voltage voda generated by the voltage follower is input to the CMOS output amplifier circuits OA2 through OAn. Thus, the same operation as the operation of the first CMOS output amplifier circuit OA1 i.e., the same voltage as the output bias voltage of the first CMOS output amplifier circuit OA1 can be obtained from the respective output terminals VOp2 through VOpn of the CMOS output amplifier circuits OA2 through OAn without being influenced by interference of another bias voltage system, i.e., transmission of an analog signal from an output terminal VOPx (where x is an output terminal of another output system) to a corresponding input terminal INx of the analog signal processing circuit ANA2.

Second Embodiment

Next, a second embodiment of the present invention will be described.

Figure 2:
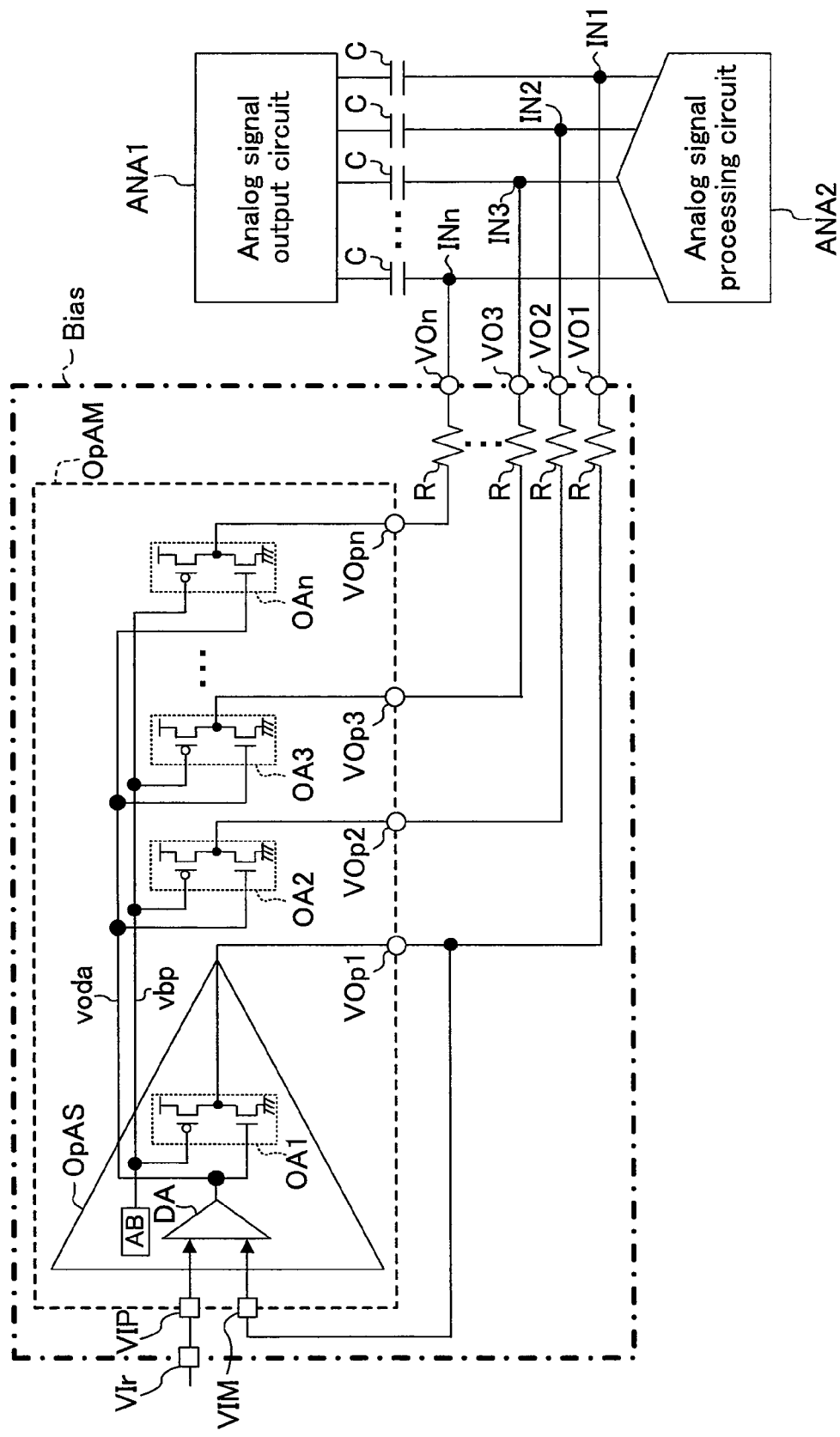
FIG. 2 is a block diagram illustrating a configuration of a bias circuit according to a second embodiment of the present invention.

FIG. 2 illustrates a bias circuit according to the second embodiment. In the first embodiment, only the configuration in which the output terminal VOp1 of the first CMOS output amplifier circuit OA1 which makes up a voltage follower is fed back to the inverting input terminal VIM of the differential amplifier circuit DA is described. According to this embodiment, the output terminal VOp1 of the first CMOS output amplifier circuit OA1 is fed back to the inverting input terminal VIM of the differential amplifier circuit DA and also is connected to one (IN1 in FIG. 2) of the input terminals of the analog signal processing circuit ANA2, thereby supplying a bias voltage to the input terminal IN1.

Therefore, according to this embodiment, reduction in power consumption and area by a corresponding amount to a single CMOS output amplifier circuit can be achieved, compared to the first embodiment.

Third Embodiment

Subsequently, a third embodiment of the present invention will be described.

Figure 3:
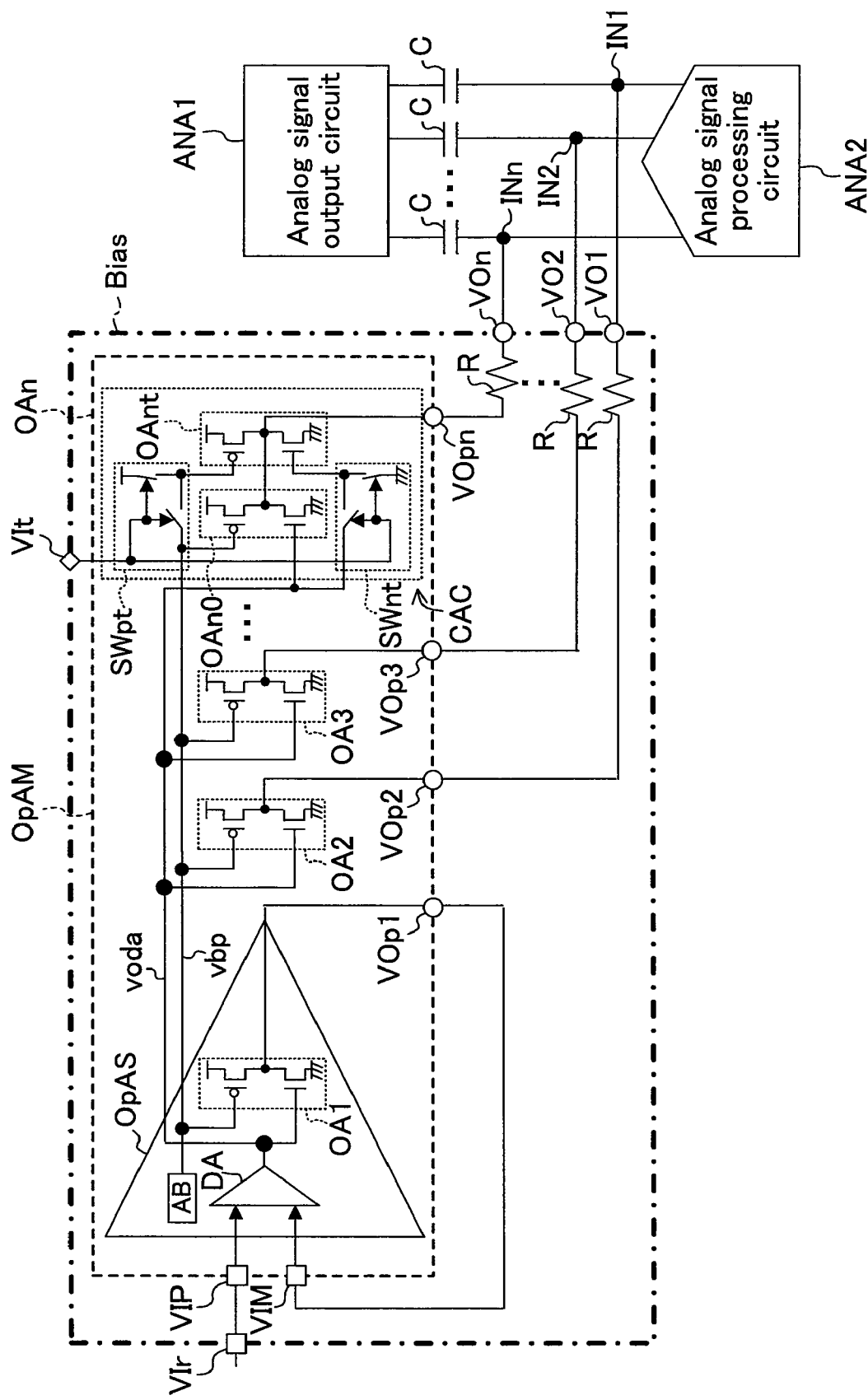
FIG. 3 is a block diagram illustrating a configuration of a bias circuit according to a third embodiment of the present invention.

FIG. 3 illustrates a bias circuit according to this embodiment. In FIG. 3, an nth CMOS output amplifier circuit OAn includes a basic amplifier circuit OAn0 having the same configuration as that of each of CMOS output amplifier circuits OA1 through OAn-1 and also includes an output current adjusting amplifier circuit OAnt having the same configuration as that of the basic amplifier circuit OAn0 and an output current adjusting circuit CAC having two switches SWtn and SWtp for controlling the operation and stop of the output current adjusting amplifier circuit OAnt.

When a frequency of an analog signal input to a corresponding input terminal (input terminal INn in FIG. 3) of the analog signal processing circuit ANA2 is high, the output current adjusting circuit CAC controls the two switches SWtn and SWtp to make the output current adjusting amplifier circuit OAnt perform in the same manner as the basic amplifier circuit OAn0, thereby adjusting an output current so that a value of the output current is twice as large as that of a current flowing from the basic amplifier circuit OAn0. A single operational amplifier of the two-stage amplifier type is configured of the nth CMOS output amplifier circuit OAn and the differential amplifier circuit DA.

Specifically, assuming that frequencies of analog signals respectively input to the input terminals IN1 through INn are different from one another, as the frequency of an analog signal is higher and the voltage of the input signal changed more rapidly, it is more highly required to quickly perform variable control of a current value of a current flowing through a corresponding input terminal so that a bias voltage is adjusted to be constant at all the time. For this reason, the output current adjusting amplifier circuit OAnt is provided.

In the bias circuit of this embodiment, only a single output current adjusting amplifier circuit OAnt shown in FIG. 3 is provided to variably control a current flowing from the CMOS output amplifier circuit OAn so that the current becomes as large as or twice as large as a current of the basic amplifier circuit OAn0. However, needless to say, a plurality of output current adjusting amplifier circuits OAnt may be prepared to perform stepwise adjustment to a necessary current value with high accuracy by performing digital control of the adjusting output amplifier circuits within an arbitrary range, i.e., by performing ON/OFF control of the switches SWtn and SWtp to operate or stop the plurality of output current adjusting amplifier circuits OAnt.

Note that, instead of the above-described plurality output current adjusting amplifier circuits, an adjusting output amplifier circuit having a different transistor size can be prepared. In such a case, control can be performed in the same manner as in the case where the plurality of adjusting output amplifier circuits are prepared.

Fourth Embodiment

Figure 4:
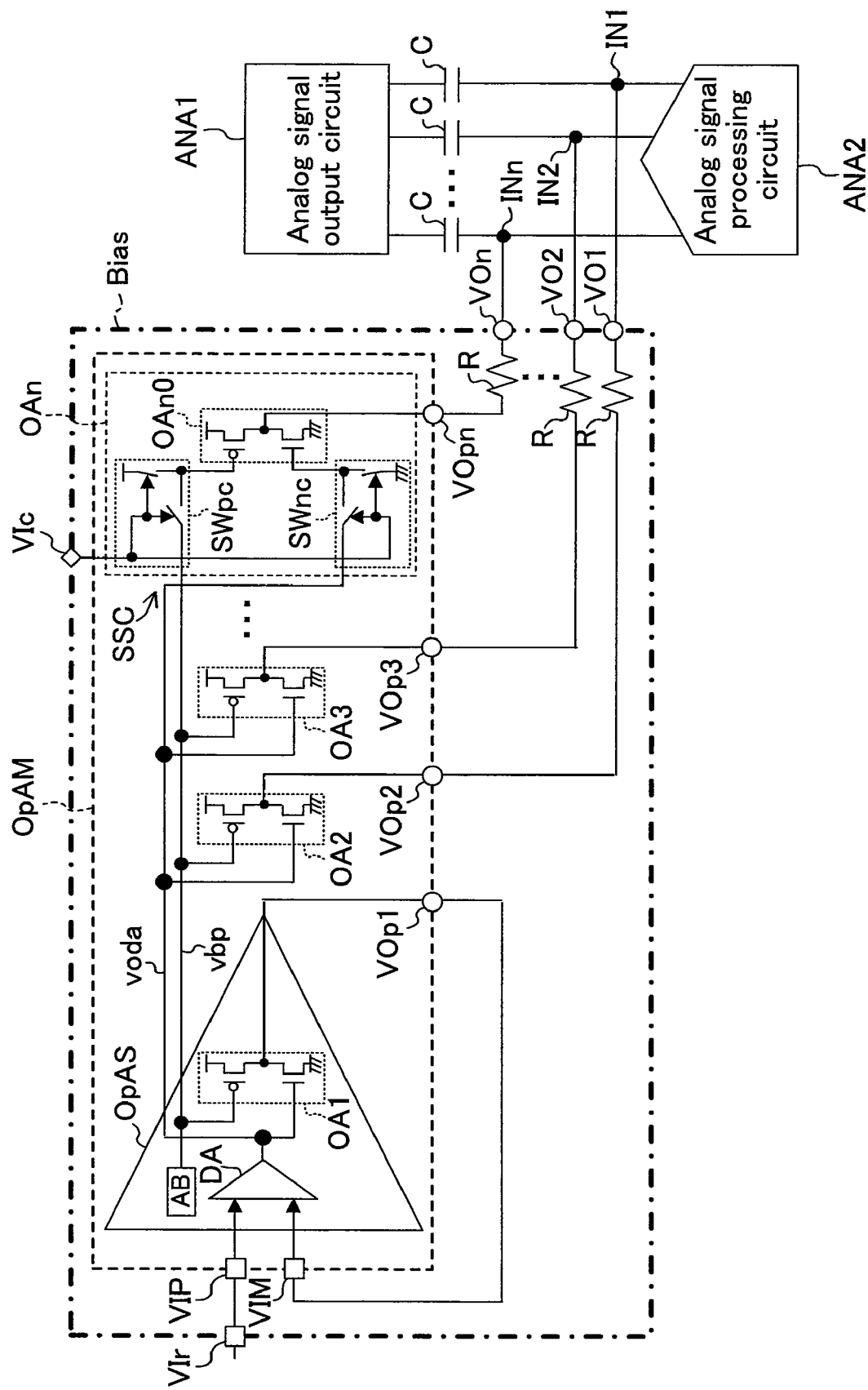
FIG. 4 is a block diagram illustrating a configuration of a bias circuit according to a fourth embodiment of the present invention.

FIG. 4 illustrates a bias circuit according to an embodiment of the present invention. According to this embodiment, when an operation mode in which an analog signal is not input to one or more of a plurality of input terminals IN1 through INn of an analog signal processing circuit ANA2 in a predetermined specific period exists, supply of a bias voltage to the one or more of the input terminals is also stopped in the specific period in which there is no signal input to the one or more input terminals.

Specifically, arbitrary one (OAn in FIG. 4) of a plurality of CMOS output amplifier circuits OA1 through OAn is configured as a CMOS output amplifier circuit OAn with start/stop function, which has the function of independently starting and stopping its operation.

The CMOS output amplifier circuit OAn with start/stop function includes a basic amplifier circuit OAn0 having the same configuration as that of each of the CMOS output amplifier circuits OA1 through OAn-1 and further includes a start/stop control circuit SSC having two switches SWpc and SWnc for controlling start and stop of the basic amplifier circuit OAn0. In the start/stop control circuit SSC, one of the switches, i.e., the switch SWpc stops supply of a bias voltage vbp to a gate of a PMOS transistor of the basic amplifier circuit OAn0 and supplies a power supply voltage to the gate, thereby performing OFF control. The other one of the switches, i.e., the switch SWcn stops supply of a voltage voda to a gate of an NMOS transistor of the basic amplifier circuit OAn0 and supplies a ground voltage to the gate, thereby performing OFF control. Both of the switches SWpc and SWnc are controlled by a control signal VIc.

The CMOS output amplifier circuit OAn with start/stop function and a differential amplifier circuit DA constitute a single operational amplifier of a two-stage amplifier type.

According to this embodiment, only a single CMOS output amplifier circuit OAn with start/stop function is provided. However, the CMOS output amplifier circuit OAn with start/stop function may be provided in each of all or some of the plurality of CMOS output amplifier circuits OA1 through OAn according to the operation mode of the analog signal processing circuit ANA2 and, using the control signal VIc as a digital signal having a several bit length, the switches SWpc and SWnc provided in the plurality of CMOS output amplifier circuits may be separately ON/OFF controlled to stop only one of the CMOS output amplifier circuits corresponding to an input terminal through which an analog signal is not input to the analog signal processing circuit ANA2 for the specific period.

Fifth Embodiment

Subsequently, a fifth embodiment of the present invention will be described.

Figure 5:
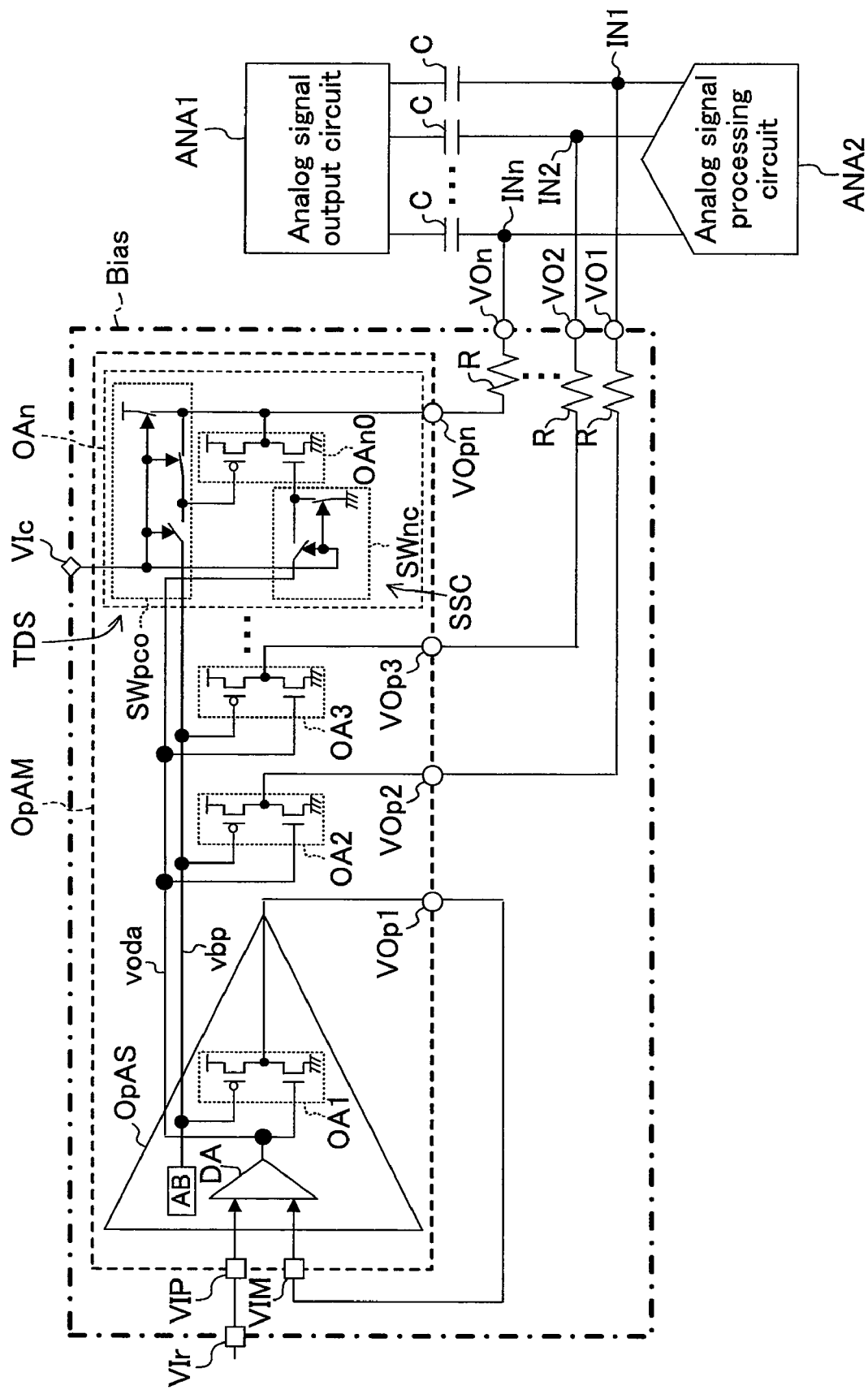
FIG. 5 is a block diagram illustrating a configuration of a bias circuit according to a fifth embodiment of the present invention.

FIG. 5 illustrates a bias circuit according to this embodiment. According to this embodiment, when a CMOS output amplifier circuit OAn with start/stop function is provided as in the fourth embodiment, deterioration with time, of input circuits (not shown) to be connected to a corresponding input terminal INn of an analog signal processing circuit ANA2 in a next stage which is connected thereto (for example, deterioration with time, of threshold of transistors configured to serve as each input circuit and the like) is prevented.

Specifically, according to this embodiment, as shown in FIG. 5, the CMOS output amplifier circuit OAn with start/stop function includes a start/stop control circuit SSC as in the fourth embodiment. However, the start/stop control circuit SSC includes a switch SWpco which is modified from the switch SWpc of the fourth embodiment (FIG. 4) and a switch SWnc having the same configuration as that of the switch SWnc. At a time when the modified switch SWpco receives a control signal VIc and supplies a power supply voltage to a gate of a PMOS transistor in a basic amplifier circuit OAn0 to perform OFF control, the switch SWpco simultaneously supplies the power supply voltage to a corresponding input terminal INn in the analog signal processing circuit ANA2 from an output terminal VOpn. The modified switch SWpco is configured as a stop state setting circuit TDS for setting a stop state of the CMOS output amplifier circuit OAn including the stop state setting circuit TDS to a stop state in which deterioration with time, of the input circuit is prevented.

Thus, in the case where the analog signal processing circuit ANA2 in a next stage, which is connected to the bias circuit Bias, has, for example, a configuration in which the corresponding input terminal INn is connected to a gate of a PMOS transistor in an input circuit, a gate voltage of the PMOS transistor in the input circuit is fixed at the power supply voltage when the CMOS output amplifier circuit OAn is stopped and an output current thereof does not flow (power-down occurs). Therefore, reduction with time in threshold of the PMOS transistor in the input circuit is not caused.

Note that with a configuration in which the corresponding input terminal INn is connected to a gate of an NMOS transistor in an input circuit, the other switch SWnc may be modified so that a base voltage (ground voltage) is supplied to a gate of the NMOS transistor in the input circuit which is connected to a corresponding input terminal INn.

Sixth Embodiment

Figure 6:
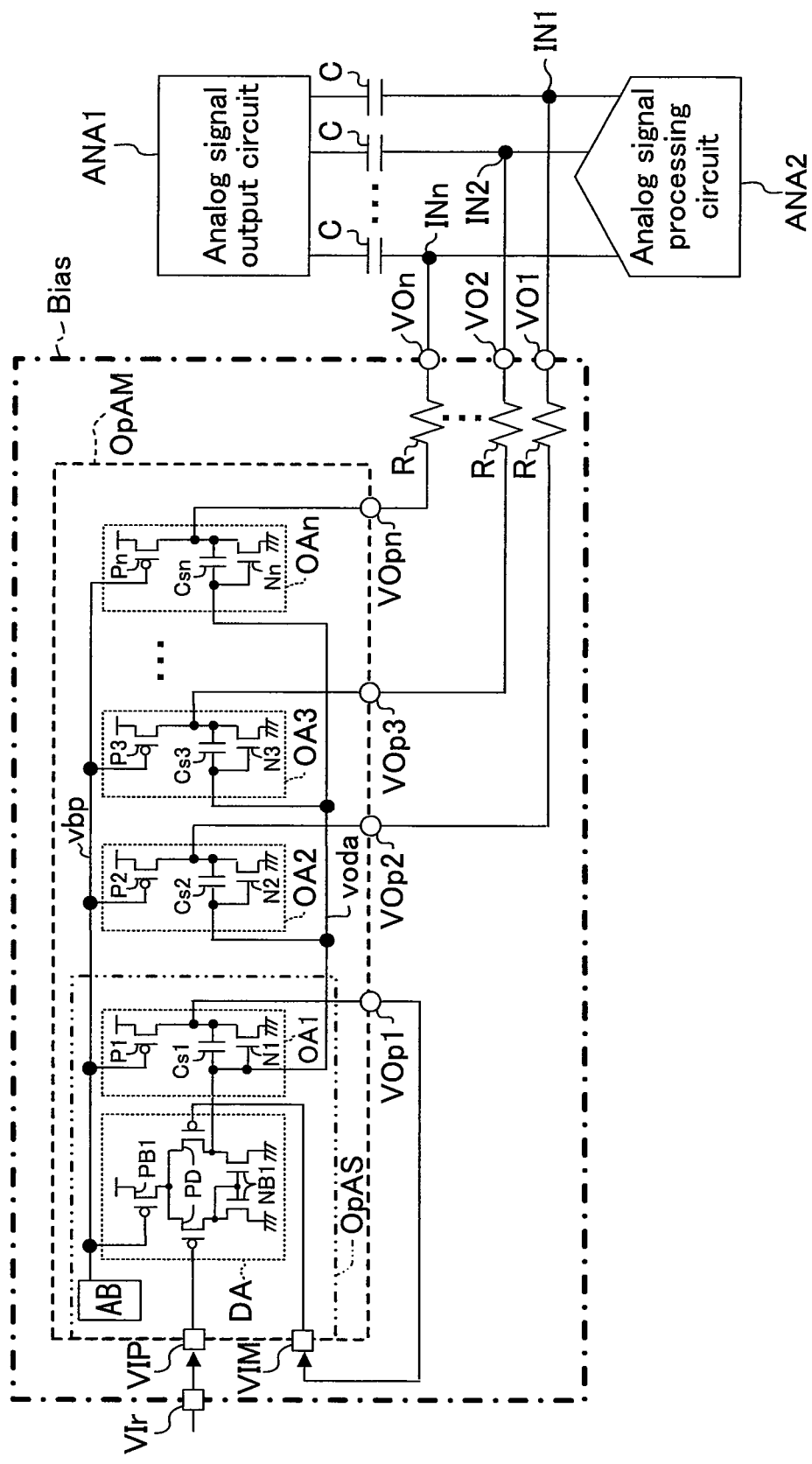
FIG. 6 is a block diagram illustrating a configuration of a bias circuit according to a sixth embodiment of the present invention.

FIG. 6 is a bias circuit according to this embodiment.

In the bias circuit Bias of FIG. 6, the multi-output operational amplifier OpAM described in each of the first through fifth embodiments is configured to include a differential amplifier circuit DA, first through nth CMOS output amplifier circuits OA1 through OAn, and a bias circuit AB for generating a bias voltage vbp to be supplied to the CMOS output amplifier circuits OA1 through OAn.

The CMOS output amplifier circuits OA1 through OAn have feedback circuits Cs1 through Csn, respectively, for connecting output terminals VOp1 through VOpn of the CMOS output amplifier circuits to an input terminal voda.

The differential amplifier circuit DA is so configured that a desired bias voltage VIr is input to a gate of a PMOS transistor, and includes PMOS transistors PD which make up a differential pair, a PMOS transistor PB1 to which a bias voltage vbp generated in the bias circuit AB is supplied and an NMOS transistor NB1 which is a load transistor. The first through nth CMOS output amplifier circuits OA1 through OAn include PMOS transistors P1 through Pn, respectively, for supplying the bias voltage vbp of the bias circuit AB, NMOS transistors N1 through Nn, respectively, to which an output voltage of the differential amplifier circuit DA is given at the gate, and feedback circuits Cs1 through Csn, respectively, each of which is connected between an input terminal voda of its own CMOS output amplifier circuit and an associated one of output terminals VOp1 through VOpn.

Note that the operational amplifier OpAS may be an operational amplifier in which the differential amplifier circuit DA is configured so that the desired bias voltage VIr is input to a gate of an NMOS transistor. In such a case, the polarity of each of transistors which make up each of the first through nth CMOS output amplifier circuits OA1 through OAn is changed.

Seventh Embodiment

Figure 7:
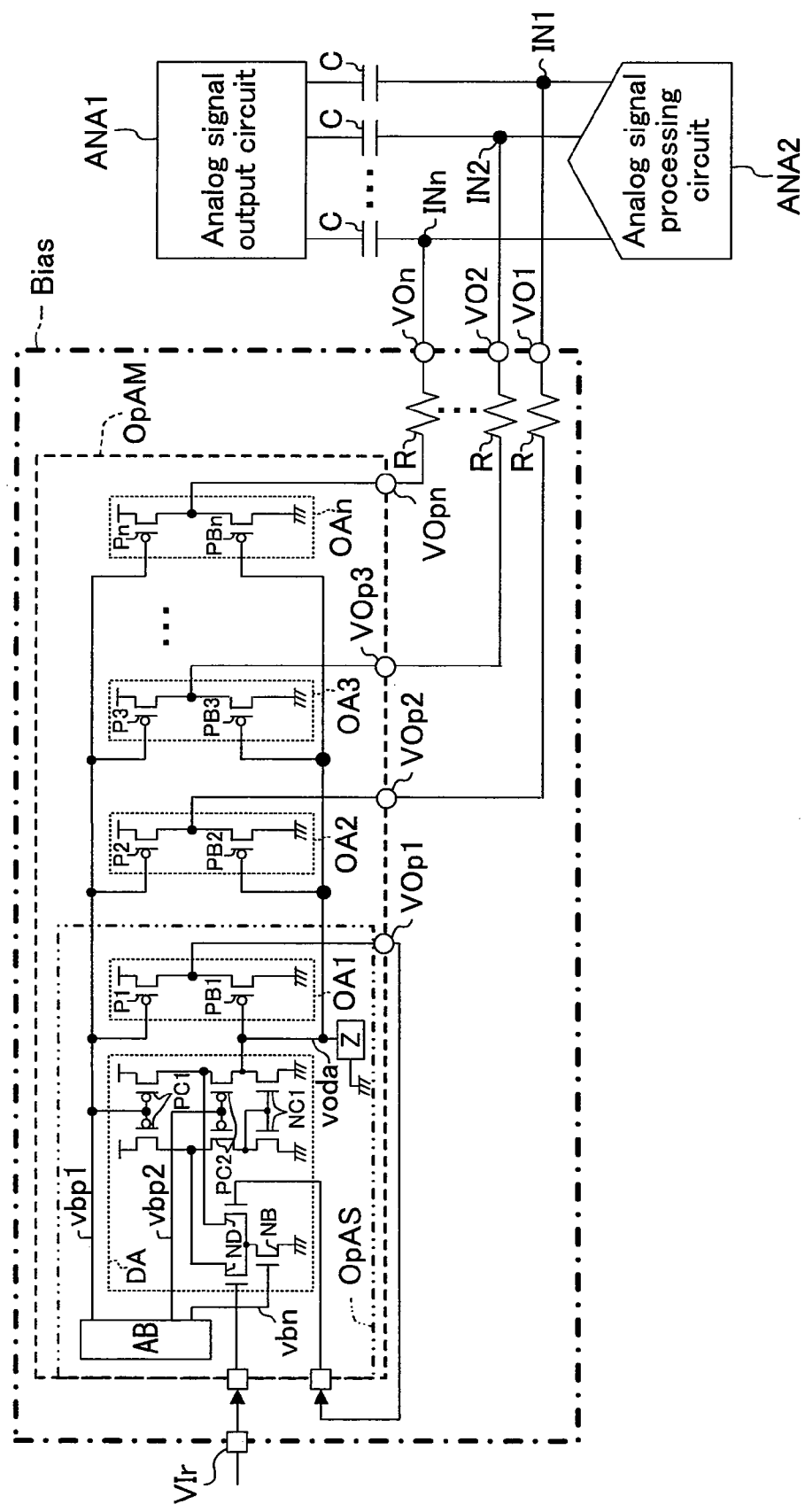
FIG. 7 is a block diagram illustrating a configuration of a bias circuit according to a seventh embodiment of the present invention.

FIG. 7 is a bias circuit according to this embodiment.

An operational amplifier OpAS according to this embodiment includes a differential amplifier circuit DA, and further includes first through nth CMOS output amplifier circuits OA1 through OAn each having an input terminal voda connected to a base voltage by a feedback circuit Z and a bias circuit AB for generating bias voltages vbp1, vbp2 and vbn to be supplied to the differential amplifier circuit DA and the first through nth CMOS output amplifier circuits OA1 through OAn.

The differential amplifier circuit DA has a configuration in which a desired bias voltage VIr is input to a gate of an NMOS transistor and includes NMOS transistors ND which make up a differential pair, an NMOS transistor NB for supplying the bias voltage vbn, a PMOS transistor PC1 which is operated with the bias voltage vbp1, a load PMOS transistor PC2 which is operated with the bias voltage vbp2, and an NMOS transistor NC1. The transistors PC1, PC2 and NC1 of the above-described three types make up a cascode circuit. Each of the first through nth CMOS output amplifier circuits OA1 through OAn includes a PMOS transistor Pn which is operated with the bias voltage vbp1, a PMOS transistor PBn configured as a source follower circuit, and a feedback circuit Z connected between an input terminal Voda of its own CMOS output amplifier circuit and a base voltage.

Eighth Embodiment

Figure 8:
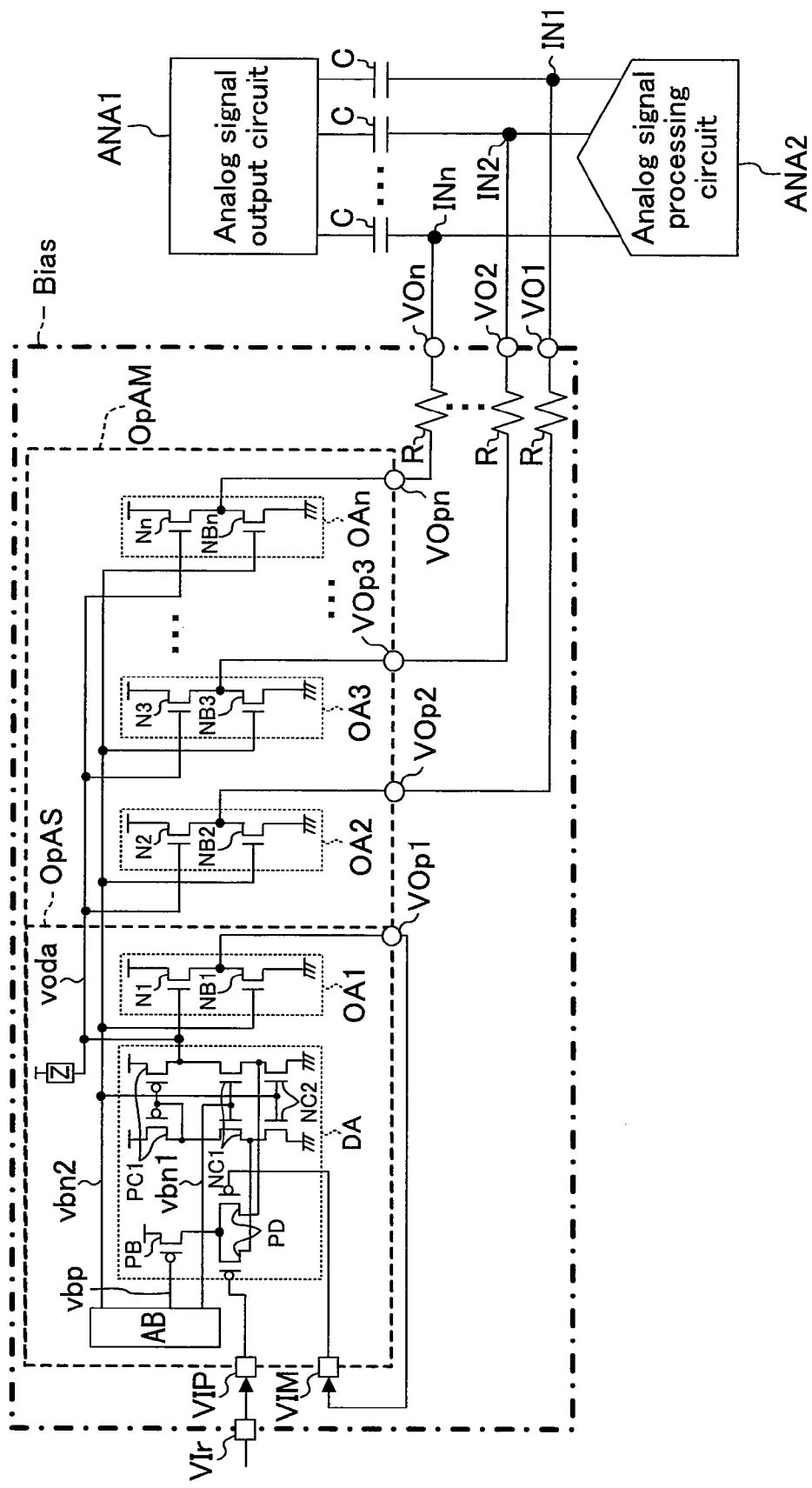
FIG. 8 is a block diagram illustrating a configuration of a bias circuit according to an eighth embodiment of the present invention.
Figure 9:
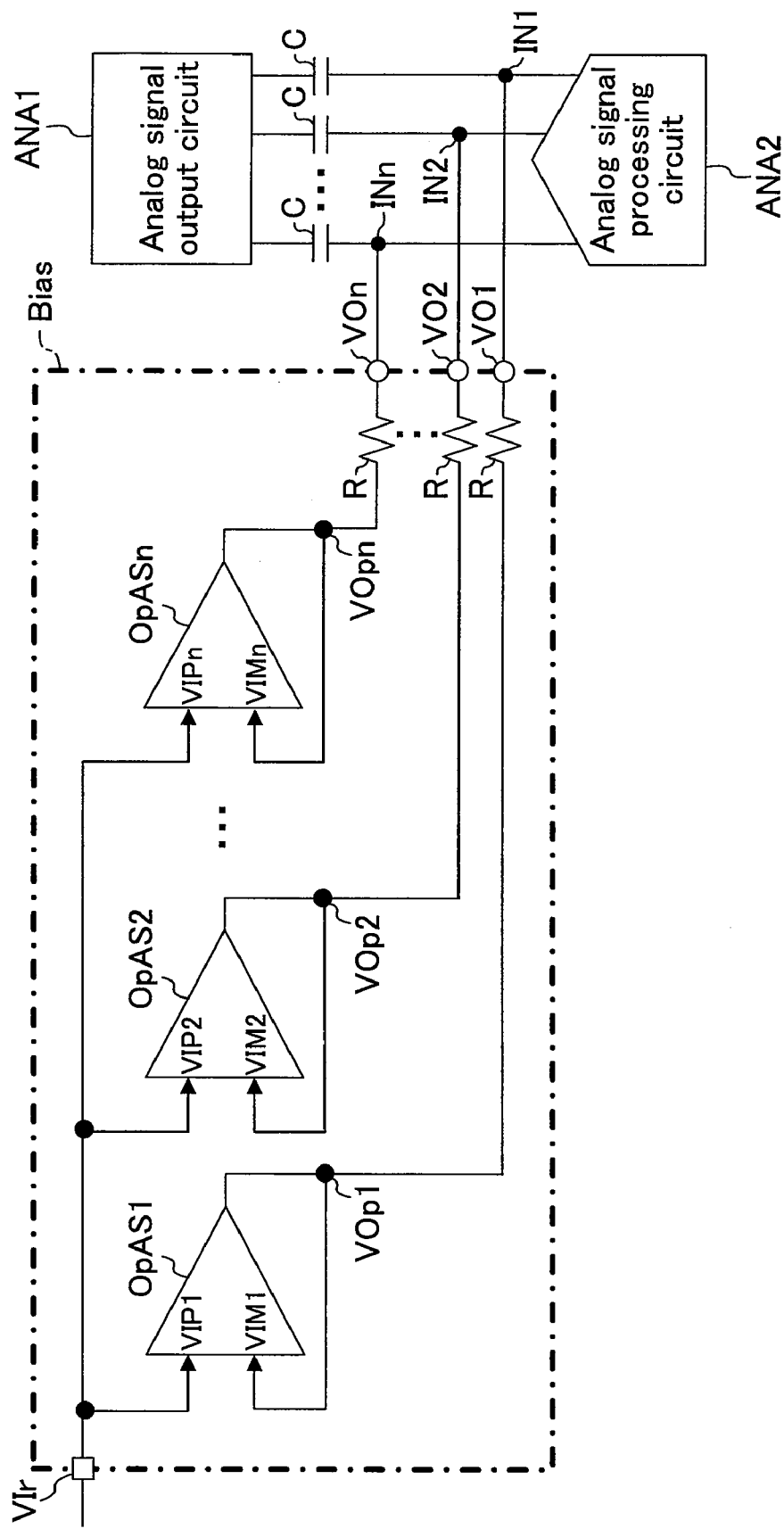
FIG. 9 is a block diagram illustrating an example of known bias circuits.
Figure 10:
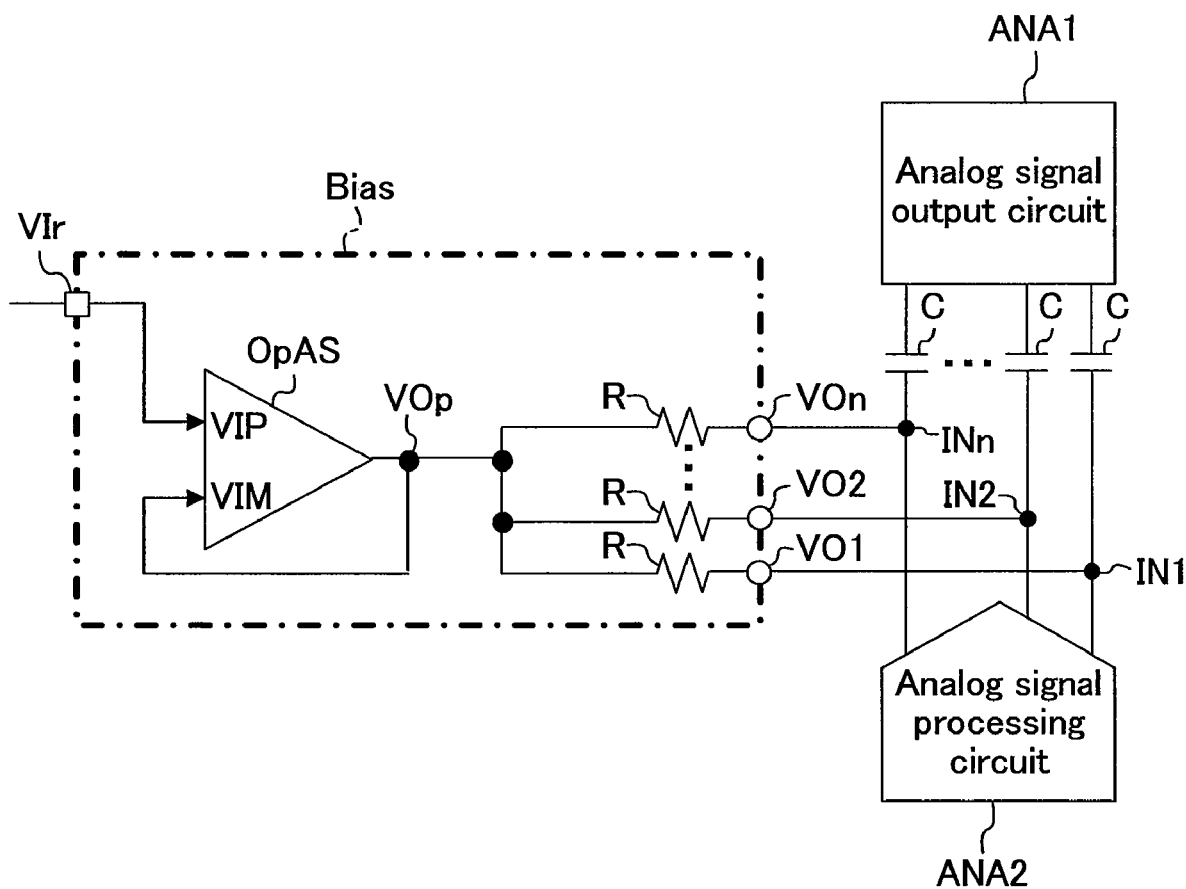
FIG. 10 is a block diagram illustrating another example of known bias circuits.
Figure 11:
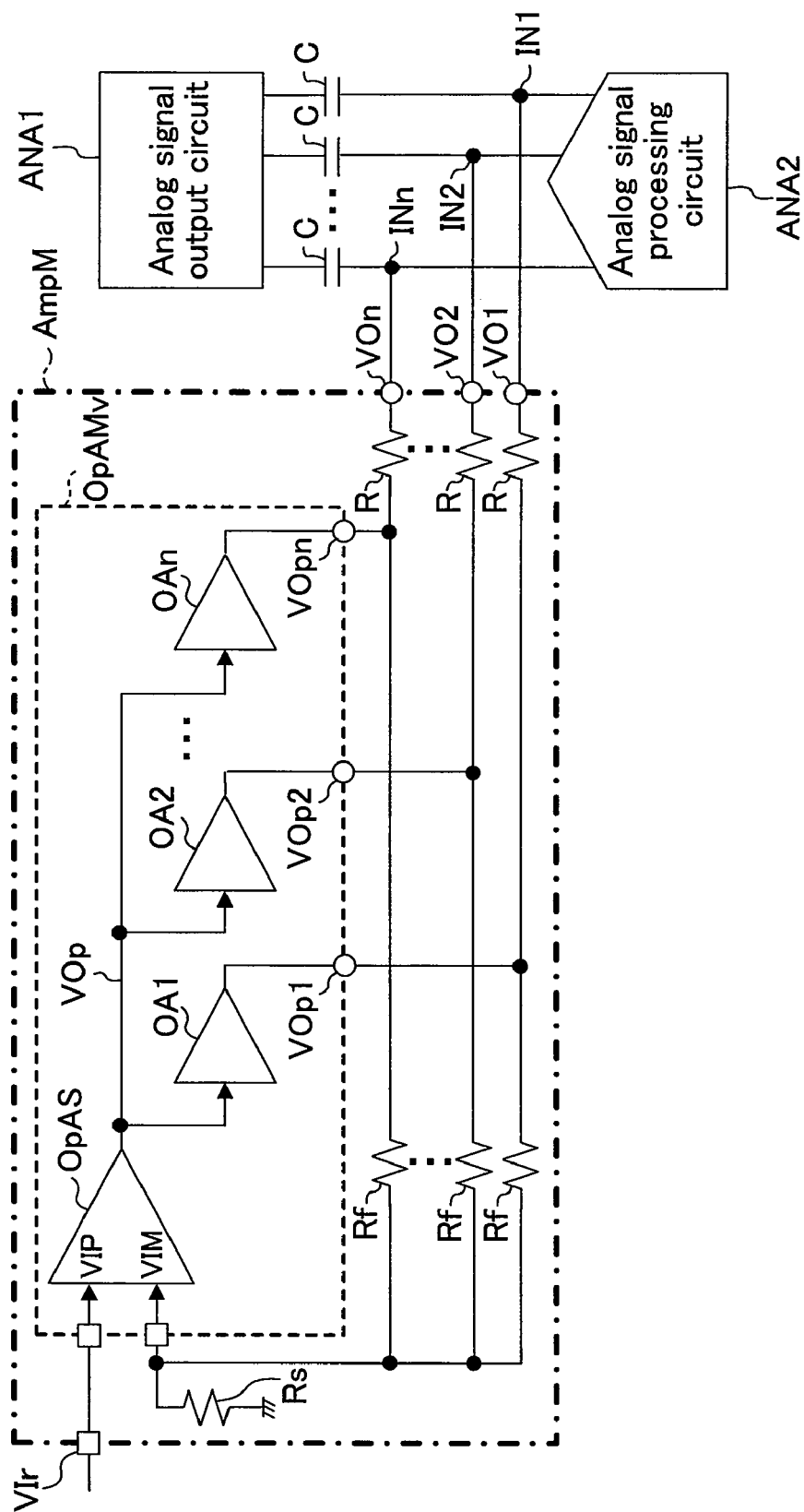
FIG. 11 is a block diagram illustrating still another example of known bias circuits.

FIG. 8 illustrates a bias circuit according to this embodiment.

An differential input multi-output operational amplifier OpAM according to this embodiment includes a differential amplifier circuit DA, and further includes output amplifier circuits OA1 through OAn each having an input terminal voda connected to a power supply voltage by a feedback circuit Z and a bias circuit AB for generating bias voltages vbp, vbp1 and vbn2 to be supplied to the differential amplifier circuit DA and the first through nth output amplifier circuits OA1 through OAn.

The differential amplifier circuit DA has a configuration in which a desired bias voltage VIr is input to a gate of a PMOS transistor and includes PMOS transistors PD which make up a differential pair, a PMOS transistor PB for supplying the bias voltage vbp, an NMOS transistor NC2 which is operated with the bias voltage vbn2, a NMOS transistor NC1 which is operated with the bias voltage vbn1 and is configured as a load transistor, and a PMOS transistor PC1. The transistors NC1, NC2 and PC1 of the above-described three types make up a cascode circuit. Each of the CMOS output amplifier circuits OA1 through OAn includes an NMOS transistor NBn which is operated with the bias voltage vbn2, an NMOS transistor Nn configured as a source follower circuit, and a feedback circuit Z connected between an input terminal Voda of its own output amplifier circuit and a power supply voltage.

INDUSTRIAL APPLICABILITY

As has been described above, according to the present disclosure, in the case where a plurality of analog signals are input to an analog signal processing circuit from an analog signal output circuit via respective capacitors, when a bias voltage such as a signal ground of the analog signals is supplied to the analog signal processing circuit, mutual interference between the input terminals of the analog signal processing circuit can be effectively prevented without causing increase in offset between the input terminals of the analog signal processing circuit and increase in area and power consumption. Therefore, a bias circuit according to any one of embodiments of the present invention is useful as a small, low power consumption and high accuracy bias circuit which can generate the above-described bias voltage.

The invention claimed is:

1. A bias circuit which outputs the same bias voltage through a plurality of output terminals thereof, the bias circuit comprising:
   an operational amplifier having a differential amplifier circuit and a built-in CMOS output amplifier circuit including a first transistor and a second transistor with a gate to which an output voltage of the differential amplifier circuit is given; and
   a plurality of CMOS output amplifier circuits each including third and fourth transistors each of which has the same configuration as that of the built-in CMOS output amplifier circuit,
   wherein in the differential amplifier circuit of the operational amplifier, a constant voltage is supplied to a non-inverting input circuit and an output of the built-in CMOS output amplifier circuit of the operational amplifier is fed back to an inverting input terminal,
   the built-in CMOS output amplifier circuit and the plurality of CMOS output amplifier circuits are connected in parallel,
   a gate of the third transistor of each of the plurality of CMOS output amplifier circuits is connected to a gate of the first transistor of the built-in CMOS output amplifier circuit and a gate of the fourth transistor of each of the plurality of CMOS output amplifier circuits is connected to the gate of the second transistor of the built-in CMOS output amplifier circuit, and
   a drain connection point of the third and fourth transistors of each of the plurality of CMOS output amplifier circuits is connected to an associated one of the plurality of output terminals.

2. The bias circuit of claim 1, wherein a drain connection point of the first and second transistors of the built-in CMOS output amplifier circuit is connected to one of the plurality of output terminals to which the plurality of CMOS output amplifier circuits are not connected.

3. The bias circuit of claim 1, wherein at least one of the plurality of CMOS output amplifier circuits includes an output current adjusting circuit which can variably adjust a current output from said at least one of the CMOS output amplifier circuits, and
   an operation of the output current adjusting circuit is controlled according to a frequency of a signal output from an output terminal to which said at least one of the output amplifier circuits is connected.

4. The bias circuit of claim 1, wherein at least one of the plurality of CMOS output amplifier circuits each includes a start/stop control circuit for starting and stopping its own CMOS output amplifier circuit.

5. The bias circuit of claim 4, wherein input circuits of an analog signal processing circuit are connected to the plurality of output terminals, respectively, and
   the start/stop control circuit includes a stop state setting circuit for setting, when stopping its own CMOS output amplifier circuit, a stop state of its own CMOS output amplifier circuit to a stop state in which deterioration with time, of the input circuits is prevented.

6. The bias circuit of claim 1, wherein in each of the built-in CMOS output amplifier circuits of the operational amplifier and the plurality of CMOS output amplifier circuits, the output terminal and the input terminal are connected via a feedback circuit.

7. The bias circuit of claim 1, wherein in each of the built-in CMOS output amplifier circuits of the operational amplifier and the plurality of CMOS output amplifier circuits, the input terminal and a base voltage are connected via a feedback circuit.

8. The bias circuit of claim 1, wherein in each of the built-in CMOS output amplifier circuits of the operational amplifier and the plurality of CMOS output amplifier circuits, the input terminal and a power supply voltage are connected via a feedback circuit.

9. The bias circuit of claim 1, wherein the differential amplifier circuit of the operational amplifier and the plurality of CMOS output amplifier circuits are provided so that the differential amplifier circuit and each of the plurality of CMOS output amplifier circuits are configured to serve as a single operational amplifier of a two-stage amplifier type.

10. A semiconductor integrated circuit comprising:
the bias circuit of claim 1;
an analog signal processing circuit provided in a subsequent stage to be connected to the bias circuit and having an input circuit for receiving a bias voltage from the plurality of output terminals of the bias circuit; and
an analog signal output circuit for outputting a plurality of analog signals to the analog signal processing circuit via a plurality of capacitors.

* * * * *